United States Patent [19]
Burkes et al.

[11] Patent Number: 5,664,187
[45] Date of Patent: Sep. 2, 1997

[54] METHOD AND SYSTEM FOR SELECTING DATA FOR MIGRATION IN A HIERARCHIC DATA STORAGE SYSTEM USING FREQUENCY DISTRIBUTION TABLES

[75] Inventors: Theresa A. Burkes, Meridian; Douglas L. Voigt, Boise, both of Id.

[73] Assignee: Hewlett-Packard Company, Palo Alto, Calif.

[21] Appl. No.: 329,349

[22] Filed: Oct. 26, 1994

[51] Int. Cl.$^6$ .............................. G06F 17/30; G06F 13/00; G06F 11/00
[52] U.S. Cl. .................. 395/621; 395/182.04; 395/616; 395/617; 395/619; 395/622; 711/114; 371/40.15
[58] Field of Search .................................. 395/600, 200; 371/40.1

[56] References Cited

U.S. PATENT DOCUMENTS

| | | | |
|---|---|---|---|
| 5,155,835 | 10/1992 | Belsan | 395/425 |
| 5,195,100 | 3/1993 | Katz et al. | 371/66 |
| 5,237,658 | 8/1993 | Walker et al. | 395/200 |
| 5,278,838 | 1/1994 | Ng et al. | 371/10.1 |
| 5,287,462 | 2/1994 | Jibbe et al. | 395/275 |
| 5,289,418 | 2/1994 | Youngerth | 365/201 |
| 5,297,258 | 3/1994 | Hale et al. | 395/275 |
| 5,392,244 | 2/1995 | Jacobson et al. | 395/600 |
| 5,463,776 | 10/1995 | Voight et al. | 395/600 |
| 5,499,253 | 3/1996 | Lary | 371/40.1 |

*Primary Examiner*—Thomas G. Black
*Assistant Examiner*—Cheryl Renea Lewis

[57] ABSTRACT

A hierarchic disk array data storage system has multiple storage disks that define a physical storage space and a RAID management system that maps the physical storage space into two virtual storage spaces. The RAID-level virtual storage space presents the physical storage space as mirror and parity RAID areas where the mirror RAID areas store data according to RAID Level 1 and the parity RAID areas store data according to RAID Level 5. The application-level virtual storage space presents the physical storage space as multiple virtual blocks which can be associated with mirror and parity RAID areas. The RAID management system migrates the virtual blocks between the mirror and parity RAID areas to optimize performance and reliability. To select virtual blocks for migration from mirror to parity RAID areas, a frequency distribution table is created to characterize the virtual blocks according to a predetermined distribution criteria. A virtual block is selected by segmenting the frequency distribution table to identify virtual blocks. The application-level virtual storage space is searched until a virtual block that satisfies the selection criterion is located. The located virtual block is then migrated to the parity RAID area.

24 Claims, 11 Drawing Sheets

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T-1 | T-1' | T | T' | S |

FIG. 2

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R-2 | R-1 | R | Q |

FIG. 3

INTERVALS

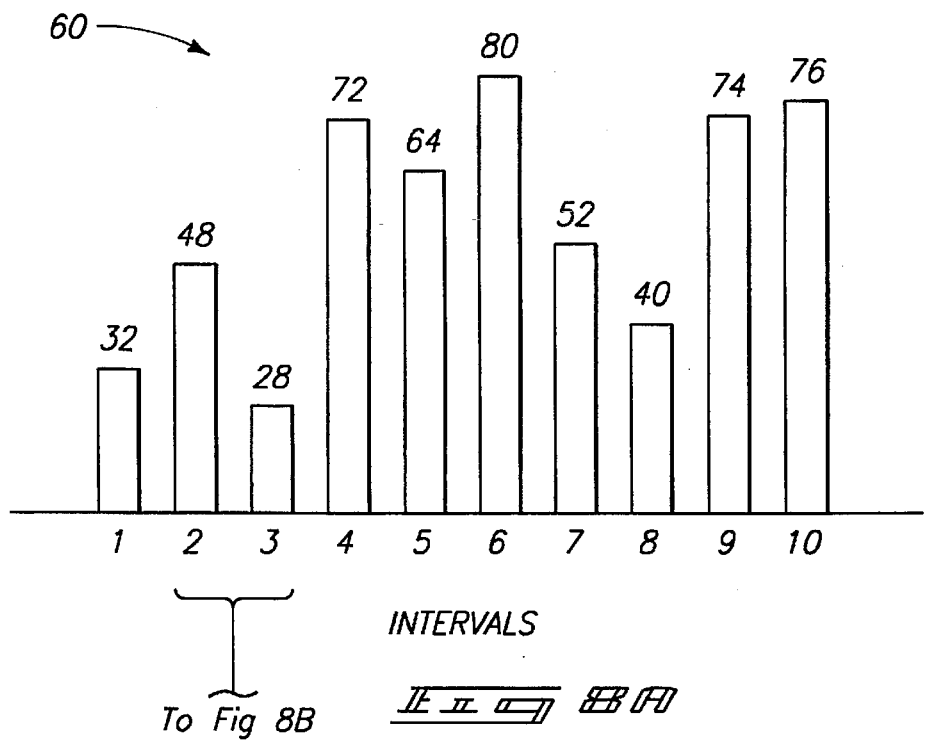
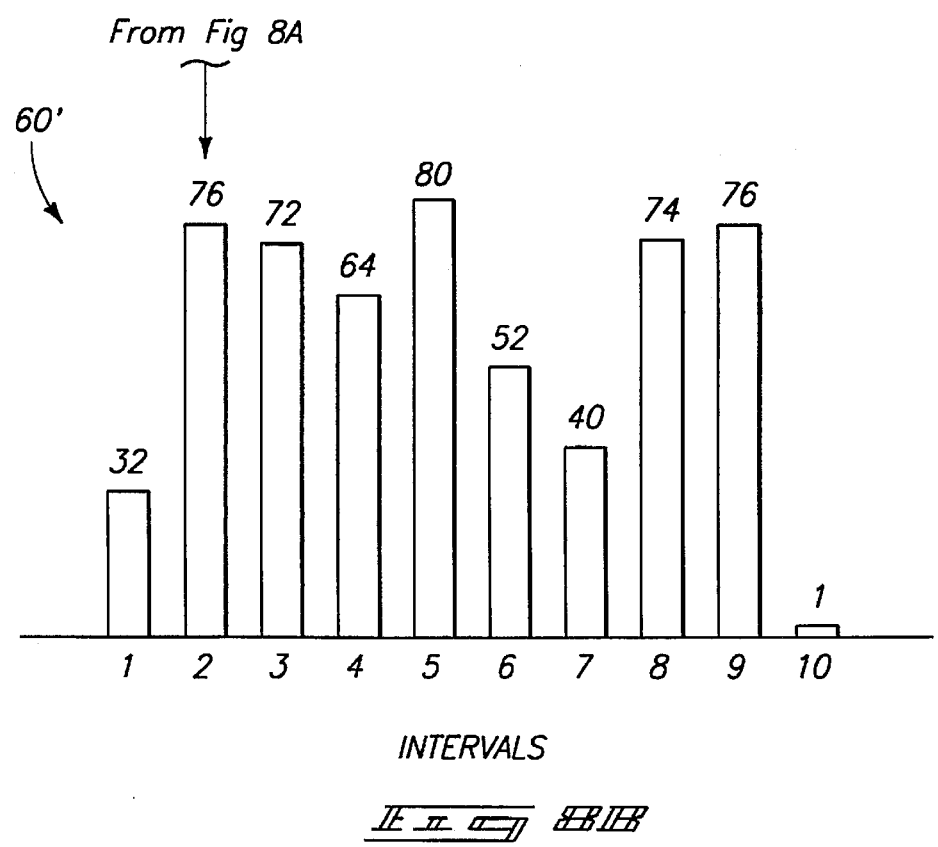

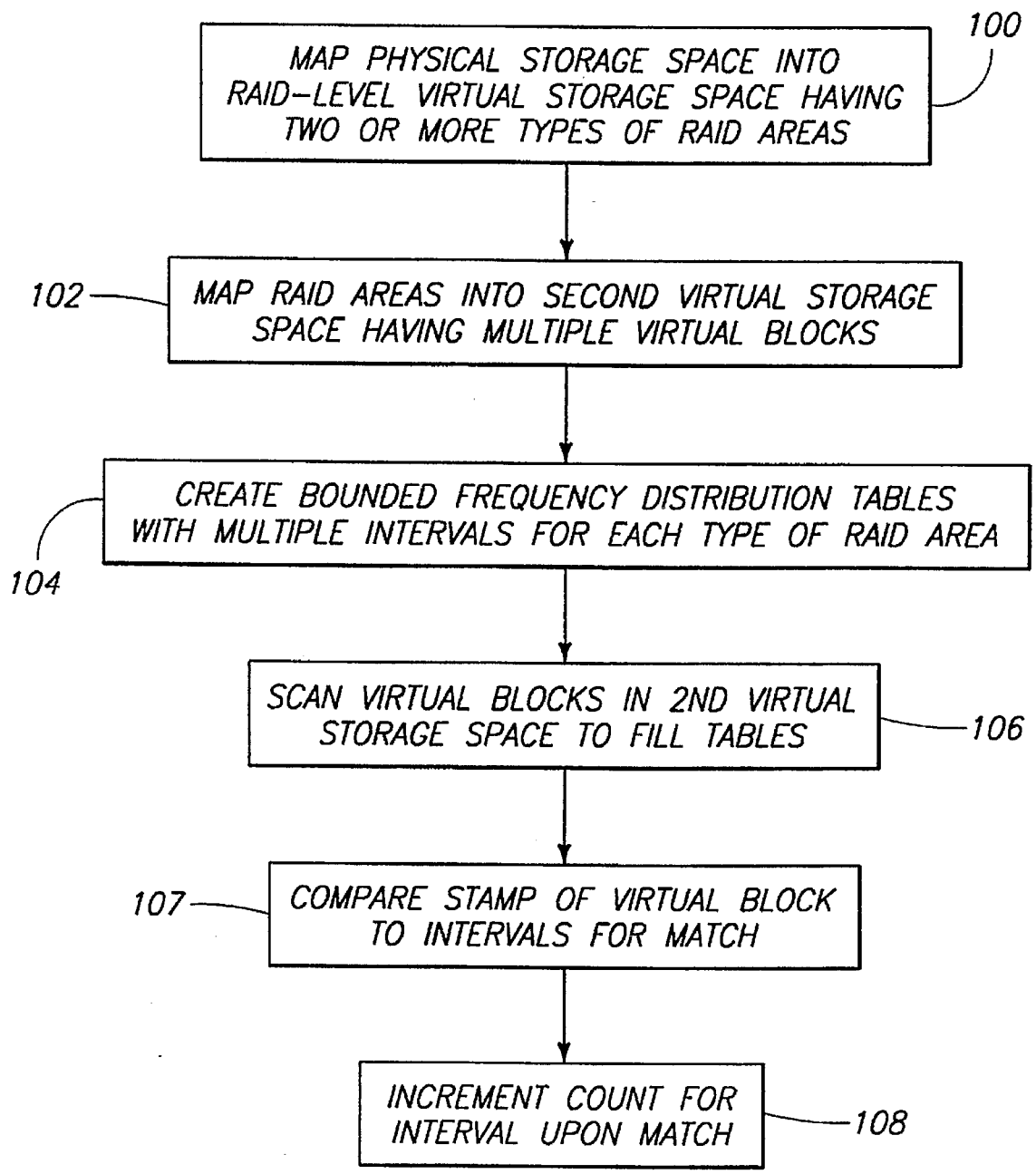
$F_{I\!I\!I\!I}$ $I\!I\!I\!I\!I$

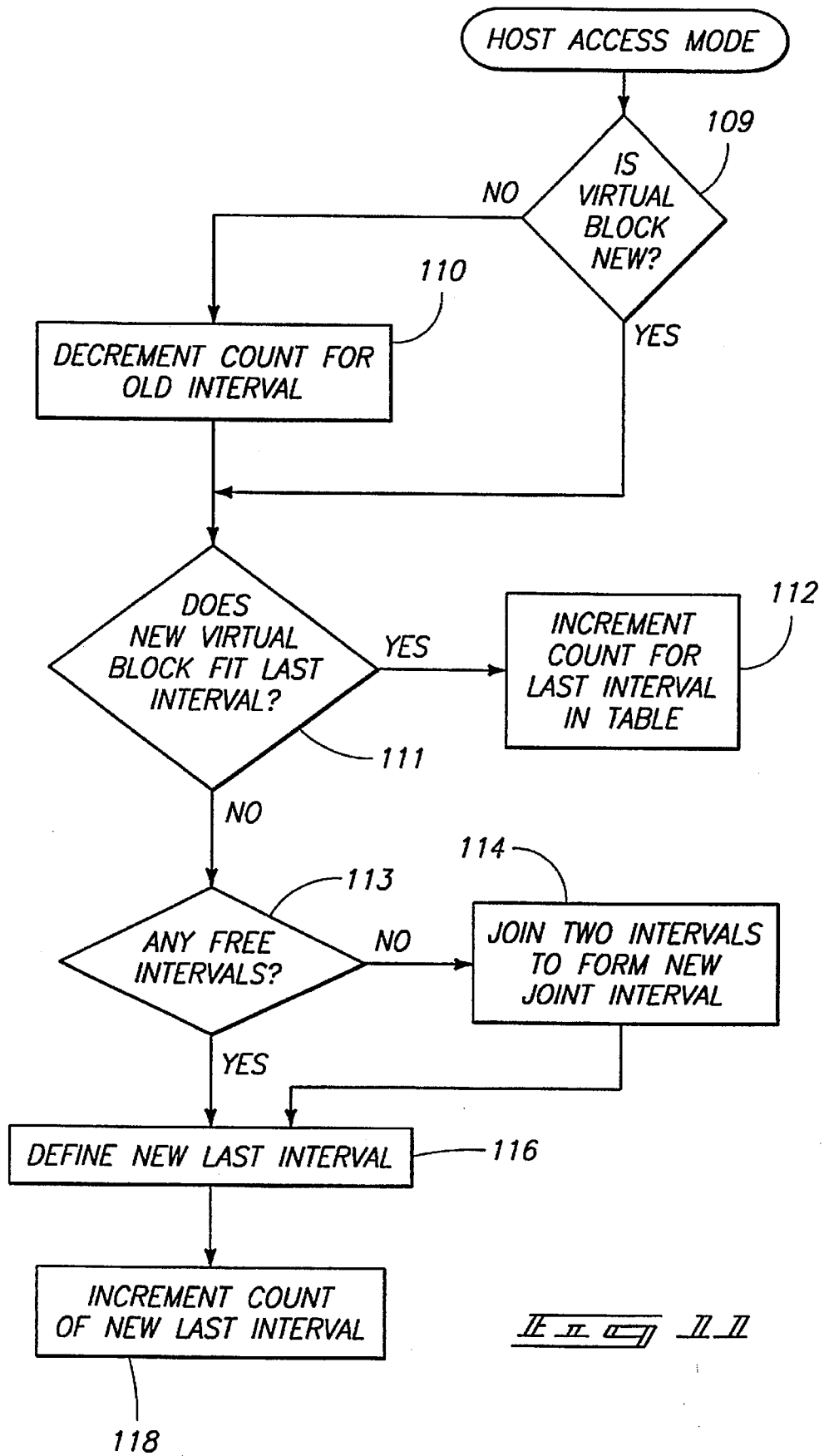

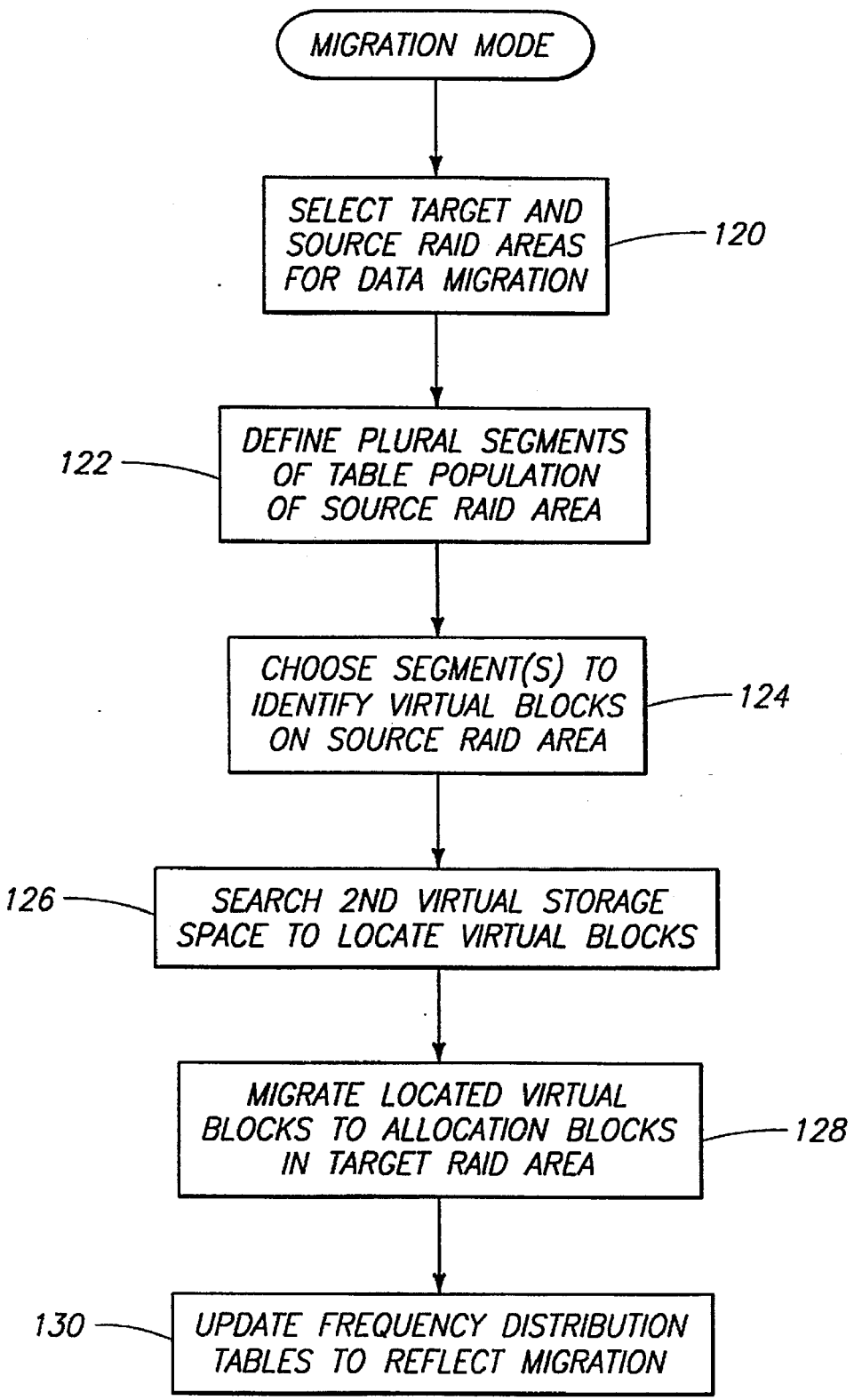

METHOD AND SYSTEM FOR SELECTING DATA FOR MIGRATION IN A HIERARCHIC DATA STORAGE SYSTEM USING FREQUENCY DISTRIBUTION TABLES

FIELD OF THE INVENTION

This invention relates to methods for selecting data for migration in a hierarchic data storage system using frequency distribution tables. This invention also relates to a hierarchic data storage system which implements such frequency distribution tables.

BACKGROUND OF THE INVENTION

Computer systems are constantly improving in terms of speed, reliability, and processing capability. As a result, computers are able to handle more complex and sophisticated applications. As computers improve, performance demands placed on mass storage and input/output (I/O) devices increase. There is a continuing need to design mass storage systems that keep pace in terms of performance with evolving computer systems.

This invention particularly concerns the mass storage systems of the disk array type. Disk array data storage system have multiple storage disk drive devices which are arranged and coordinated to form a single mass storage system. There are three primary design criteria for mass storage systems: cost, performance, and availability. It is most desirable to produce memory devices that have a low cost per megabyte, a high input/output performance, and high data availability. "Availability" is the ability to access data stored in the storage system and the ability to insure continued operation in the event of some failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

SUMMARY OF THE INVENTION

This invention provides a data storage system that optimizes performance and reliability. The data storage system includes a disk array having a plurality of storage disks and a disk array controller to coordinate data transfer to and from the disks. The storage disks define a physical storage space. The data storage system also includes a RAID management system operatively coupled to the disk array controller for mapping two virtual storage spaces into the physical storage space of the storage disks. A RAID-level virtual storage space presents the physical storage space as mirror and parity RAID areas that store data according to RAID Level 1 (mirror redundancy) and RAID Level 5 (parity redundancy). An application-level virtual storage space presents the physical storage space as multiple virtual blocks. The set of all virtual blocks defines a population. The RAID management system migrates virtual blocks between the mirror and parity RAID areas so that data undergoes a change in redundancy from RAID Level 1 to RAID Level 5.

The data storage system conducts migration based upon one of two preferred policies: data access recency and data access frequency. Under the data access recency policy, data is migrated based upon how recently the data has been accessed by the user. Under the data access frequency policy, data is migrated based upon how often the data is accessed by the user. Older data or less frequently accessed data is typically a candidate for migration from the higher performance RAID Level 1 to the lower performance RAID Level 5.

The data storage system of this invention employs frequency distribution tables to identify virtual blocks for migration. Preferably, one frequency distribution table is provided for each RAID level. The tables characterize data stored in the RAID areas according to a predetermined distribution criteria. The frequency distribution tables are bounded with a set number of intervals. A count is associated with each interval to represent the number of virtual blocks that satisfy the distribution criteria for that interval. The total number of virtual blocks in each frequency distribution table is the count of the population.

The RAID management system selects the virtual blocks for migration between a source RAID area and a target RAID area by segmenting the frequency distribution table of the source RAID area to identify a selection criterion for virtual blocks. The application-level virtual storage space is searched only until a virtual block that satisfies the selection criterion is found. The located virtual block is then migrated from the source RAID area to the target RAID area.

The use of frequency distribution tables is advantageous because the data storage system need not sort all virtual blocks to detect the oldest or least frequently used. Rather, the data storage system merely identifies a selection criterion for selecting candidates for migration, and uses the criterion to select candidates from a subset of the population having a sufficient number of candidates for migration. The process can be halted early upon locating enough virtual blocks to satisfy the storage request. Considerable efficiency is gained through this technique.

DESCRIPTION OF THE DRAWINGS

Preferred embodiments of the invention are described below with reference to the following accompanying drawings depicting examples embodying the best mode for practicing the invention.

FIG. 2 is a diagrammatic illustration of storage space on multiple storage disks and shows data storage according RAID Level 1.

FIG. 3 is a diagrammatic illustration of storage space on multiple storage disks and shows data storage according RAID Level 5.

FIG. 6 demonstrates how the table is initially filled.

FIG. 8 shows the frequency distribution table of FIG. 5 before joinder of two intervals and the same frequency distribution table following joinder of two intervals to illustrate a technique for generating a new interval within the bounded table.

FIG. 9 demonstrates the effect on the tables resulting from migration of data between the two RAID levels.

FIG. 10 is a flow diagram of a method for initializing frequency distribution tables employed in a hierarchic data storage system according to this invention.

FIG. 11 is a flow diagram of using the frequency distribution tables during a host access mode of operation according to this invention.

FIG. 12 is a flow diagram of using the frequency distribution tables during a migration mode of operation according to this invention.

DETAILED DESCRIPTION OF THE INVENTION

This disclosure of the invention is submitted in furtherance of the constitutional purposes of the U.S. Patent Laws "to promote the progress of science and useful arts". U.S. Constitution, Article 1, Section 8.

Figure 1:
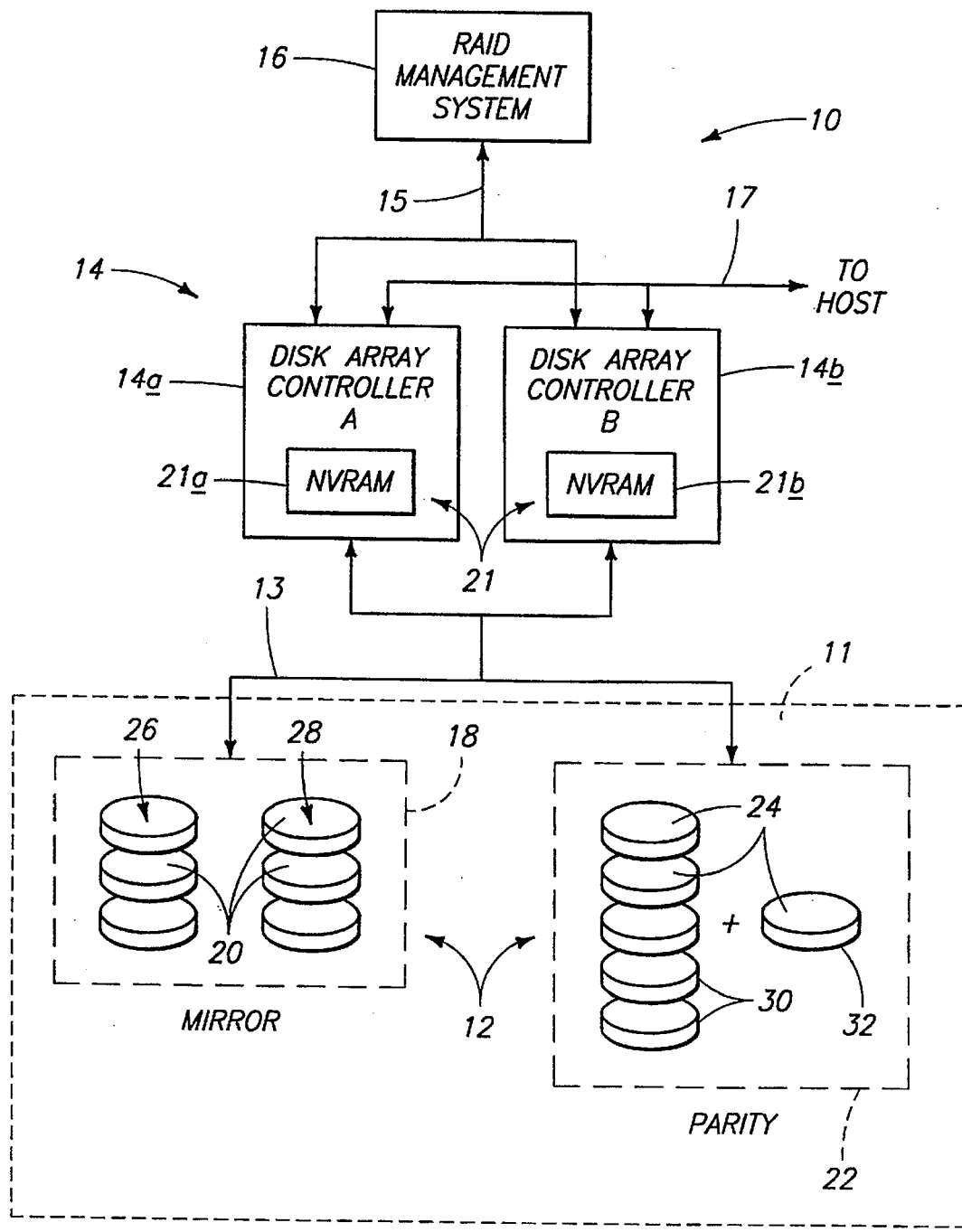
FIG. 1 is a diagrammatic block diagram of a disk array data storage system according to this invention.

FIG. 1 shows a data storage system 10 constructed according to this invention. Preferably, data storage system 10 is a disk array data storage system which includes a hierarchic disk array 11 having a plurality of storage disks 12, a disk array controller 14 coupled to the disk array 11 to coordinate data transfer to and from the storage disks 12, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, *The RAIDBook: A Source Book for RAID Technology*, published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14 or within the host computer to provide a data manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A 14a and disk array controller B 14b. Dual controllers 14a and 14b enhance reliability by providing continuous backup and redundancy in the event that one controller becomes inoperable. This invention can be practiced, however, with a single controller or other architectures.

The hierarchic disk array 11 can be characterized as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID level 1, and other areas can be allocated for a second reliability storage level, such as parity or RAID level 5. The various mapping techniques and virtual spaces concerning RAID levels are described below in more detail.

Data storage system 10 includes a memory map store 21 that provides for persistent storage of the virtual mapping information used to map different storage spaces onto one another. The memory map store is external to the disk array, and preferably resident in the disk array controller 14. The memory mapping information can be continually or periodically updated by the controller or RAID management system as the various mapping configurations among the different views change.

Preferably, the memory map store 21 is embodied as two non-volatile RAMs (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to the data storage system 10. One preferred construction is a self-refreshing, battery-backed DRAM (Dynamic RAM).

The dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

As shown in FIG. 1, disk array 11 has multiple storage disk drive devices 12. Example sizes of these storage disks are one to three Gigabytes. The storage disks can be independently connected or disconnected to mechanical bays that provide interfacing with SCSI bus 13. In one implementation, the data storage system is designed with twelve active mechanical bays and four additional mechanical bays. Four SCSI buses are used to interface these bays with disk array controller 14 (i.e., one bus per 3–4 mechanical bays). If the active bays are fully loaded, the data storage system has an example combined capacity of 12–36 Gigabytes. Disk array controller 14 recognizes storage disks 12 regardless into which bay they are plugged. The data storage system 10 is designed to permit "hot plug" of additional disks into available mechanical bays in the disk array while the disk array is in operation.

The storage disks 12 in disk array 11 can be conceptualized, for purposes of explanation, as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the data storage system. The mirror redundancy is diagrammatically represented by the three pairs of disks 20 in FIG. 1. Original data can be stored on a first set of disks 26 while duplicative, redundant data is stored on the paired second set of disks 28.

FIG. 2 illustrates the storage of data according to RAID Level 1 in more detail. The vertical columns represent individual disks, of which disks 0, 1, 2, and 3 are illustrated. The physical storage space contained in this disk array of four disks can be configured into multiple stripes, as represented by the horizontal rows. A "stripe" extends across the storage disks and is comprised of numerous, equal sized segments of storage space where one segment is associated with each disk in the array. That is, a segment is the portion of a stripe that resides on a single disk. Each stripe holds a predetermined amount of data which is distributed across the storage disks. Some segments of a stripe are used for original data while other segments are used for redundant data.

In this example of mirror redundancy (RAID Level 1), data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration of six disks, original data is stored on the five disks 30 and redundant "parity" data is stored on the sixth disk 32.

FIG. 3 shows a parity RAID area layout in more detail. Similar to the mirror RAID area layout of FIG. 2, the physical storage space of disks 0, 1, 2, 3 can be configured into multiple equal sized stripes. In this illustrated example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed by some function, such as an exclusive OR function which is represented by the symbol "$\oplus$". The parities for the first four stripes (with the subscript numeral representing the corresponding stripe) are as follows:

$P_0$ = Segment 0 $\oplus$ Segment 1 $\oplus$ Segment 2
 = Disk 0 $\oplus$ Disk 1 $\oplus$ Disk 2
$P_1$ = Segment 3 $\oplus$ Segment 4 $\oplus$ Segment 5
 = Disk 0 $\oplus$ Disk 1 $\oplus$ Disk 3
$P_2$ = Segment 6 $\oplus$ Segment 7 $\oplus$ Segment 8
 = Disk 0 $\oplus$ Disk 2 $\oplus$ Disk 3
$P_3$ = Segment 9 $\oplus$ Segment 10 $\oplus$ Segment 11
 = Disk 1 $\oplus$ Disk 2 $\oplus$ Disk 3

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. The regions are grouped together to form RAID areas in one virtual view of the storage space. Additionally, another (host-defined) view of storage space is presented to the user or host so that the RAID areas and data redundancy storing techniques are transparent to the user or host. These features are discussed below in more detail with reference to FIG. 4.

Data storage system 10 manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. RAID management system 16 shifts, organizes, and otherwise manages the data between the mirror and parity RAID areas in accordance with a defined performance protocol. The process of moving data between the mirror and parity RAID areas is referred to as "migration".

Data storage system 10 tries to place the more performance-critical data in the mirror RAID areas since this affords the highest performance and reliability. The performance protocols implemented by RAID management system 16 includes one of two preferred migration policies. According to the first migration policy, known as "access frequency", the most frequently accessed data on the hierarchic disk array is maintained in the mirror RAID area 18. Less frequently accessed data is maintained in the parity RAID area 22. According to a second migration policy, known as "access recency", the most recently accessed data is maintained in the mirror RAID area 18 while the less recently accessed data is stored in parity RAID area 22. Other performance protocols may be employed. Ideally, such protocols are defined based upon the specific computer application and the needs of the user.

Additionally, the RAID management system 16 automatically "tunes" the storage resources of a data storage system according to a function of two parameters: size of the physical storage capacity and size of the present amount of user data being stored in the data storage system. Initially, all data is stored in mirror RAID areas because this affords the highest performance and reliability. As more data is added to the data storage system, the data is migrated between mirror RAID areas and parity RAID areas to optimize performance and reliability. As the data storage system approaches full capacity, more and more data is migrated to parity RAID areas in an effort to meet all demands by the user while still providing reliability through redundancy. Accordingly, the data storage system of this invention affords maximum flexibility and adaptation. It does not require the user to select a specific storage regime, but instead can adapt to any demand placed on it by the user.

Figure 4:
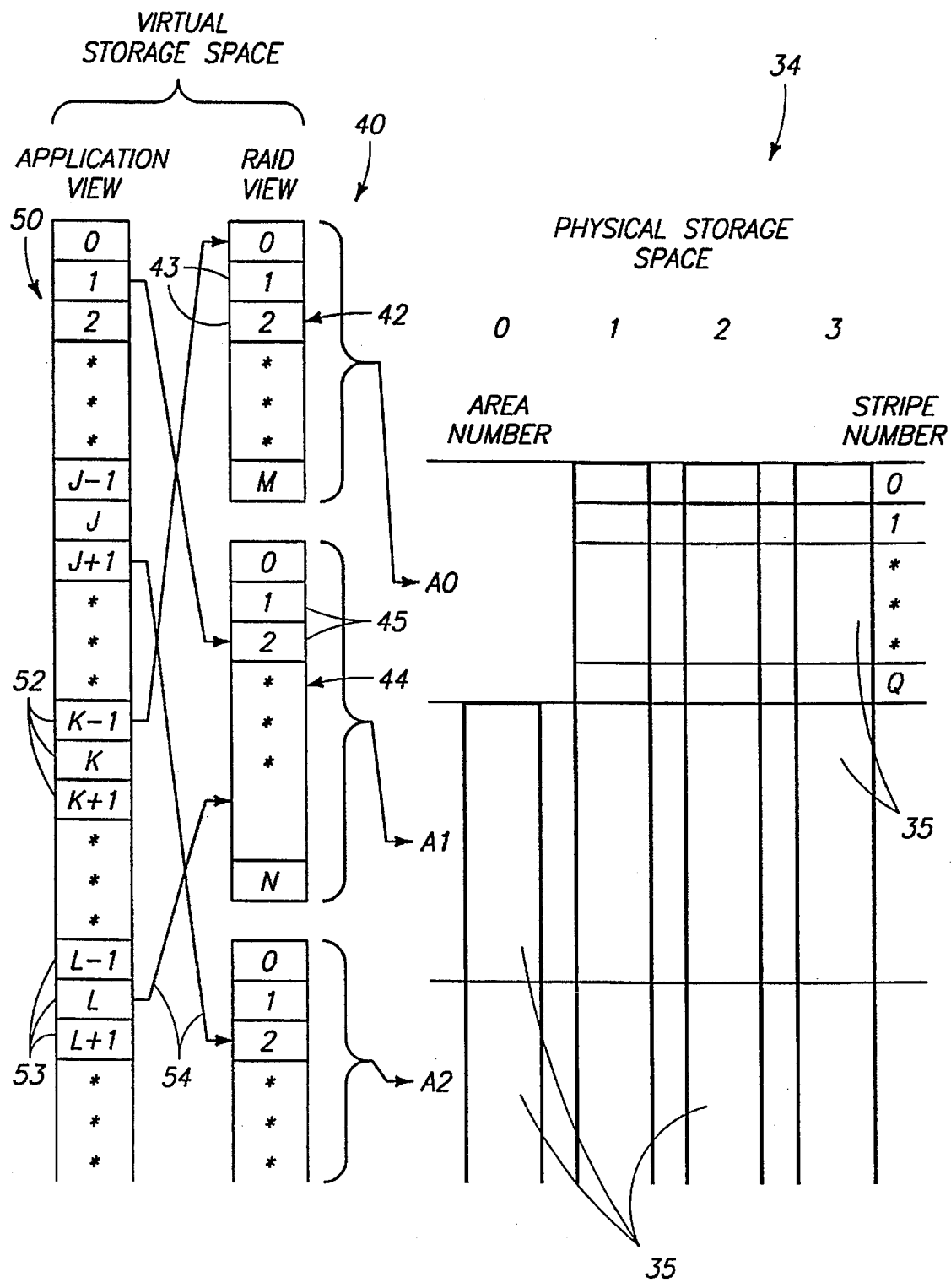
FIG. 4 is a diagrammatic illustration of a memory mapping arrangement of this invention where two virtual storage spaces are mapped onto a physical storage space.

FIG. 4 illustrates a memory mapping of the available storage space of data storage system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. Example storage capacities for such disks are 1–3 Gigabytes. The storage space 34 is partitioned into areas A0, A1, A2, etc. Individual areas contain numerous stripes, such as stripes 0-Q in area A0. Individual areas also contain numerous regions 35. Regions 35 preferably consist of a selected number of uniform sized segments on every storage disk so that the regions are equal in size across the entire disk array. An example size of one region 35 is one Megabyte.

The storage space of the disks are mapped into a first, intermediate, RAID-level virtual view 40 of the physical storage space 34. This first virtual view is conceptually a set of RAID areas which can be mapped to a second application view that represents a contiguously addressable storage space. The physical configuration and RAID views of the storage space are hidden from the application view.

The RAID area storage space 40 is the view of storage that identifies the mirror and parity storage space. For instance, a RAID area 42 may represent a mirror RAID area of M allocation blocks 43 while RAID area 44 may represent a parity RAID area of N allocation blocks 45. The allocation blocks 43 and 45 are preferably equal sized, with an example size being 64 Kilobytes. These RAID areas relate to corresponding physical areas A0, A1, A2, etc., on the physical storage space 34. As an example, sixteen 64K allocation blocks 43 or 45 at the RAID virtual view can be mapped onto a single 1M region 35.

The mirror and parity RAID areas may or may not consume the entire storage space 34 of the disk array. Accordingly, during certain applications, there may be unused and undesignated storage space that does not correspond to a particular RAID area. However, such storage space can be converted into a mirror or parity RAID area. It is also noted that the RAID areas are shown as being mapped into contiguous areas on the disk array, where each region associated with a RAID area is located at the same physical address on each storage disk. The RAID areas may alternatively be mapped into non-contiguous areas on the disk array as well.

The storage space available in the RAID areas is mapped into a second, front end, application-level virtual view 50 which is a view of storage as defined by and presented to the user or host application program. When viewed by the user or host application program, the application-level virtual view 50 can represent a single large storage capacity indicative of the available storage space on storage disks 12. Virtual storage space 50 presents a view of a linear set of equal sized storage virtual blocks 52 and 53, referenced individually as 0, 1, 2, ... J–1, J, J+1, ..., L–1, L, L+1, ..., etc. Virtual blocks 52 and 53 are preferably the same size as the allocation blocks in RAID area 40, with an example size being 64 Kilobytes. The virtual block storage space 50 is represented by a table of references or pointers (as represented by arrows 54) to allocation blocks in the view presented by RAID areas 40. Virtual blocks 52 and 53 at the application virtual view 50 are therefore associated with allocation blocks 43 and 45 at the RAID virtual view 40 via the pointers maintained in the virtual block table. There are at least two types of RAID areas that can be referenced from the virtual block table: mirror and parity.

The RAID management system 16 can dynamically alter the configuration of the RAID areas over the physical storage space. The number of RAID areas for each type may be increased or decreased depending upon the amount of user data being stored in the system and the size of the physical disk storage space. As a result, the mapping of the RAID areas in the RAID-level virtual view 40 onto the disks and the mapping of the front end virtual view 50 to RAID view 40 are generally in a state of change. The memory map store in NVRAMs 21a and 21b (FIG. 1) maintains the current mapping information used by RAID management system 16 to map the RAID areas onto the disks, as well as the information employed to map between the two virtual views. As the RAID management system dynamically alters the RAID level mappings, it also updates the mapping information in the memory map store to reflect the alterations.

The migration operation of memory system 10 will now be described with reference to FIGS. 1 and 4.

For purposes of continuing explanation, virtual blocks 53 of the application-level virtual storage space 50 reference associated allocation blocks 45 in parity RAID area 44 stored in area A1 of physical storage space 34. Such virtual blocks 53 are referred to as "parity virtual blocks" while the associated allocation blocks 45 are referred to as "parity allocation blocks". Similarly, virtual blocks 52 reference associated allocation blocks 43 in mirror RAID area 42 stored in area A0 of physical storage space 34. Such virtual blocks 52 are referred to herein as "mirror virtual blocks" while the associated allocation blocks 43 are referred to as "mirror allocation blocks".

In general, to migrate data from one RAID area to another, a virtual block associated with an allocation block of a first RAID level type (such as mirror or Level 1) is selected. Then, an unused allocation block representing a second RAID level type (such as parity or Level 5) is located. If an unused allocation block cannot be located, one is created. Data is next transferred from the allocation block previously associated with the selected virtual block to the unused allocation block which causes the data to undergo a redundancy level change. For example, data once stored according to mirror redundancy would now be stored according to parity redundancy, or vice versa. As a final step, the mapping 54 of the application-level virtual storage space 50 to the RAID-level virtual storage space 40 is modified and updated to reflect the shift of data. The selected virtual block that was formerly associated with an allocation block of the first RAID level type now references via an updated pointer an allocation block of the second RAID level type which contains the migrated data. Any mapping change occurring during this transaction would be updated in memory map store 21.

The continuing discussion provides a more detailed explanation of migrating data between mirror and parity storage areas according to preferred methods and sequences of this invention. To migrate data from parity to mirror storage, the following sequence is employed:

1. The RAID management system locates an unused mirror allocation block 43 in a mirror RAID area 42.

2. If none can be found, the RAID management system creates a mirror allocation block (discussed below).

3. The RAID management system suspends new storage requests to the virtual block to be migrated.

4. The RAID management system waits until all active data storage requests to the virtual block are completed.

5. The data from the parity allocation block 45 associated with virtual block 53 is read into a temporary memory buffer.

6. The data is then written to the mirror allocation block 43 chosen in step 2.

7. The virtual block table is modified to reference the new location of the data in the mirror allocation block 43.

8. The suspended storage requests are resumed.

According to the above procedure, a virtual block 53 in the application-level virtual view 50 migrated from parity to mirror storage. Relative to the intermediate virtual view 40, data has migrated from a parity allocation block 45 in parity RAID area 44 to a mirror allocation block 43 in mirror RAID area 42. In the physical storage space data has moved from area A1 to area A0.

If an unused mirror allocation block cannot be located (step 1 above), the RAID management system tries the following preferred sequence of three techniques. First, the RAID management system will try to locate an unused (and thus undesignated) RAID area, which can be converted to a mirror RAID area without violating the system threshold of unused RAID-level storage that is needed to guarantee that migration can always proceed. If this fails and the system has more than the reserved amount of unused RAID-level storage, the system migrates data within parity storage to collect unused parity allocation blocks into unused RAID areas. If this migration yields an unused RAID area that can be converted to a mirror RAID area as above, then the system converts it to a mirror RAID area. Otherwise, the system alternately migrates data from mirror to parity storage, packs mirror storage, and converts unused RAID-level storage to parity until the system increases unused RAID-level storage sufficiently for the location of an unused mirror allocation block or a conversion of an unused RAID area to a mirror RAID area. Since mirror allocation blocks occupy more physical storage space than parity allocation blocks, this last technique will result in a net increase in the amount of unused RAID-level storage.

The creation/conversion protocol used to locate and establish unused mirror allocation blocks is advantageous because it permits the RAID management system to selectively adjust the memory/allocation between parity and mirror areas according to the amount of user data and the size of physical storage space. As data usage and storage capacity vary, the RAID management system employs one or more of the above three techniques to maximize the amount of data held in mirror storage.

The RAID management system attempts to avoid the situation in which a storage request must wait for the space-making sequence to yield an unused mirror allocation block by creating unused RAID areas during idle time. However, in some situations, storage requests may be suspended during the space-making sequence. The RAID management system configures the virtual block storage space in such a way that the virtual space will be smaller than the RAID view. This ensures that a free space equal to at least one RAID area is set aside for migration or other purposes. In this manner, the sequence of techniques will always yield an unused mirror allocation block.

To migrate data from mirror to parity storage, the following sequence is employed:

1. The RAID management system chooses a virtual block from 52 to migrate from mirror to parity storage according to a migration policy such as access recency or access frequency.

2. The RAID management system locates an unused parity allocation block 45 in a parity RAID area 44.

3. If such a block cannot be found, space reserved for migration is converted to a parity RAID area according to the above described creation techniques.

4. New storage requests to the virtual block to be migrated are suspended.

5. The RAID management system waits until all active storage requests to the virtual block are completed.

6. Data is read from the mirror allocation block 43 associated with virtual block 52 into a temporary memory buffer.

7. The data is written to the chosen parity allocation block 45.

8. The virtual block table is modified to reference the new location of the data in parity allocation block 45.

9. Data requests to the virtual block are resumed.

The above two nine-step sequences provide examples of how the memory system of this invention can operate to migrate data between two different levels of redundancy.

Data is migrated between parity and mirror RAID areas using one of the two preferred migration policies of data access recency and data access frequency. In general operation, the data storage system of this invention wants to migrate the oldest or least frequently accessed virtual blocks from mirror to parity storage. Contrarily, it might be useful to migrate the newest or most frequently accessed virtual blocks from parity to mirror storage. One of the tasks of the data storage system is to select the appropriate virtual blocks for migration.

According to this invention, the virtual blocks are tagged with a monotonically increasing mark to assist in the selection process. If the migration policy is access recency, the virtual blocks are tagged with a time stamp indicating when the data was stored therein. The time stamp is preferably generated by a counter in the disk array controller 14 which outputs an incremental tick about every minute (in one implementation, every 65.5 seconds). The counter thereby forms suitable means for marking such storage blocks, although other marking means may alternatively be employed. For access frequency, the virtual blocks are tagged with a frequency stamp indicating the number of times the data therein has been accessed. The frequency stamp is an integer value that is increased by one with each access of the corresponding virtual block.

One straightforward technique for locating the appropriate virtual blocks for data migration is to sort the entire second virtual storage space 50 by time or frequency stamp. The sorting would yield the oldest/youngest or least frequently/most frequently accessed virtual blocks for migration between parity and mirror RAID areas. This technique is less preferred, however, because it takes considerable memory resource and processing time to sort all of the virtual blocks. The shortcomings of the sorting technique become more pronounced as the size of user data increases. The processing time is a non-linear function of the number of virtual blocks to be sorted. As the number of blocks increases, the processing time becomes longer.

A second and more preferred technique of this invention is to statistically select suitable virtual blocks without resorting to a full sort. According to this technique, one or more frequency distribution tables are established by the RAID management system 16 to statistically characterize the virtual blocks in terms of their time or frequency stamps. The frequency distribution table(s) can then be processed to identify a certain stamp threshold that segments the older/younger or less frequently/more frequently accessed virtual blocks from the remaining population of virtual blocks. Once a segment stamp threshold is identified, the application-level virtual storage space can be quickly searched until a sufficient number of virtual blocks within the segment have been found. The search effort is then halted. The data in the located virtual blocks is manipulated to carry out the desired function, such as migration to other allocation blocks. The statistical selection technique optimizes both memory usage and processing time and is therefore preferred over the full sorting technique.

FIGS. 5–12 demonstrate the various uses, creation, and maintenance of frequency distribution tables in hierarchic data storage systems according to this invention. These aspects and corresponding novel methods will be explained with reference to the flow diagram of FIGS. 10–12. Preferably, the methods described herein are implemented as firmware in RAID management system 16.

FIG. 10 illustrates an initialization process. The first two steps 100 and 102 establish the RAID environment for the hierarchic data storage system. At step 100, RAID management system 16 maps the physical storage space provided by disk array 12 into RAID-level virtual storage space 40. The RAID-level virtual storage space presents the physical storage space as multiple RAID areas that store data according to various RAID levels, such as RAID Level 1 and RAID Level 5. At step 102, the RAID management system maps the RAID-level virtual storage space into application-level virtual storage space which presents the physical storage space as multiple virtual blocks. The virtual blocks are associated with corresponding RAID areas. Data is stored in the virtual blocks according to the RAID level of the associated RAID area.

At step 104, the RAID management system creates one or more frequency distribution tables. Preferably, one frequency distribution table is created for each type of RAID area. The frequency distribution tables are preferably formed in a volatile RAM in the disk array controller 14 and rebuilt after each system initialization. Alternatively, the distribution table can be resident in the NVRAMs of memory map store 21 in disk array controller 14. The NVRAM implementation is preferred if it is foreseen that rebuilding the table after each system initialization is too time consuming. Aspects of these tables are described in more detail with reference to FIGS. 5 and 6.

Figure 5:
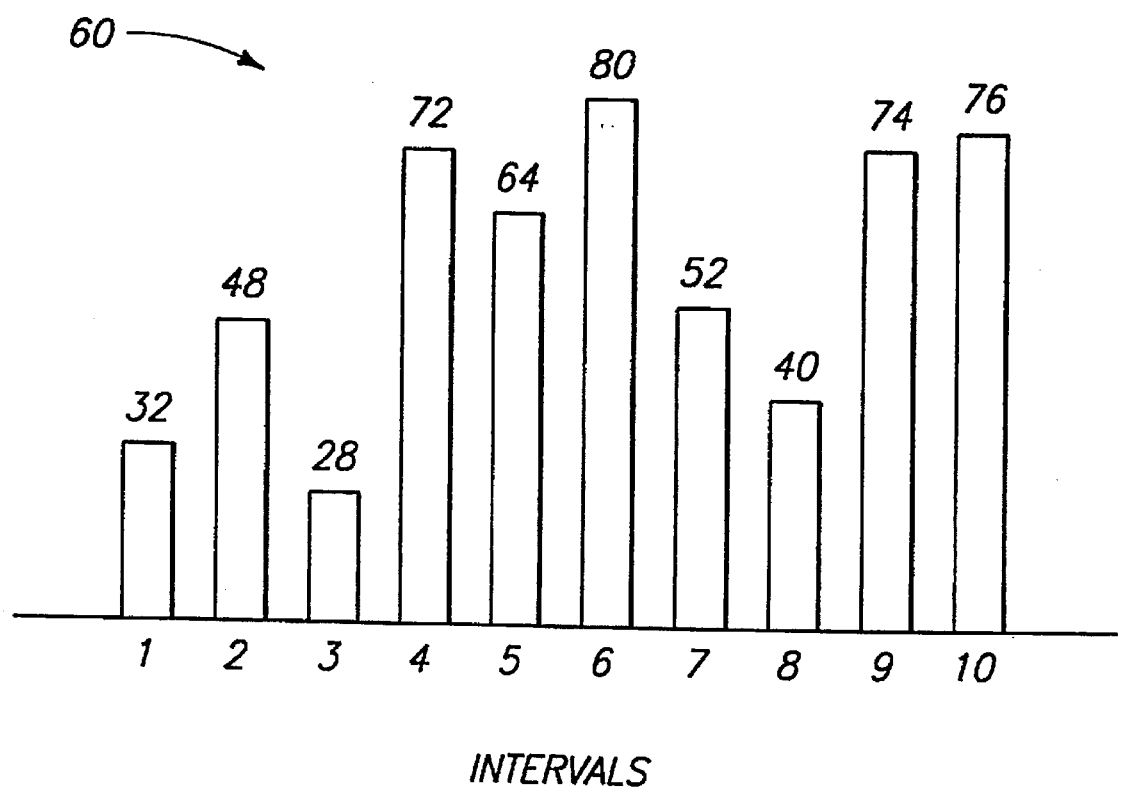
FIG. 5 is a frequency distribution table according to this invention. The frequency distribution table is depicted in FIG. 5 in its statistical bar graph representation.
Figure 6:
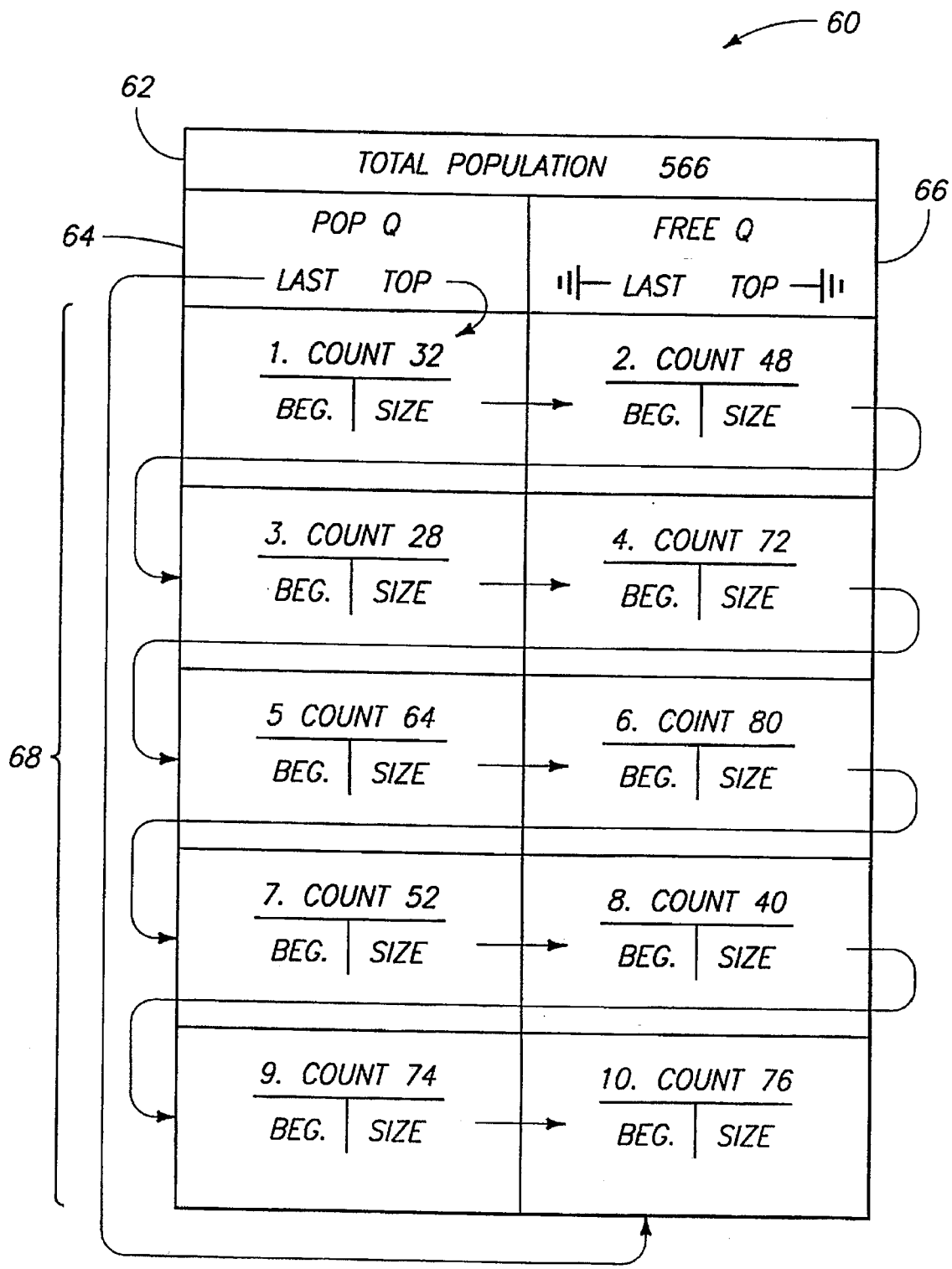
FIG. 6 is the frequency distribution table of FIG. 5, represented in an implementation format with pointers.

FIG. 5 illustrates a frequency distribution table 60 in a bar graph format and FIG. 6 illustrates the same table in a memory format conceptualization. Frequency distribution table 60 statistically characterizes the data stored on the data storage system according to a predetermined distribution criteria. Two preferred distribution criteria are data access recency or data access frequency. The table makes the characterization at the virtual block level in second virtual storage space 50. Thus, the table contains statistical information about the virtual blocks being used to store user data.

Frequency distribution table 60 is preferably bounded with a fixed number of intervals. An example number of intervals is ten, as shown in FIGS. 5 and 6. The intervals are labeled generically as 1–10, but such intervals actually consist of a range of values from a beginning boundary value to an ending boundary value. If the distribution criteria is access recency, the intervals are temporal in scope where each interval covers a range of time stamps associated with the virtual blocks. An example interval consists of 1024 time stamps which, at 65.5 seconds per stamp, covers all of the virtual blocks used in a time period of approximately one day. If the distribution criteria is access frequency, the intervals relate to frequency values where each interval covers a range of frequency stamps associated with the virtual blocks. The various intervals and counts under the access frequency regime depend upon how actively the user accesses its data.

The table contains the number of virtual blocks that occur within each interval. This is represented by the vertical bars and associated counts in FIG. 5. For example, thirty-two virtual blocks have a time or frequency stamp that falls within interval 1; forty-eight Virtual blocks have a time or frequency stamp that falls within interval 2; and so on. The table also tabulates a cumulative frequency or total number of virtual blocks to define the entire population. In this case, the total population consists of 566 virtual blocks.

In FIG. 6, frequency distribution table 60 contains a first field 62 which stores the total population of 566. The table also contains a population queue 64, a free queue 66, and ten interval fields 68. Population queue 64 maintains the interval elements for the current population whereas free queue 66 tracks the unused interval elements. Each interval field 68 contains the count for the associated interval (i.e., thirty-two for interval 1, forty-eight for interval 2, and so on), the beginning boundary value, and the size of the interval. From the beginning boundary value and the interval size, the ending boundary value can be readily computed.

The frequency distribution table is created during system initialization by scanning the virtual blocks contained in the application-level virtual storage space. In the beginning, population queue 64 is empty and free queue 66 contains ten unused interval elements. The count and beginning boundary value for all ten interval fields 68 default to zero. The size for each interval field is initialized to a default size, such as 1024. The table is then statistically constructed based upon the stamps, such as the time or frequency stamps, of the virtual blocks (step 106 in FIG. 9). The number of virtual blocks satisfying each interval is counted and input to the appropriate interval field 68.

Figure 9A:
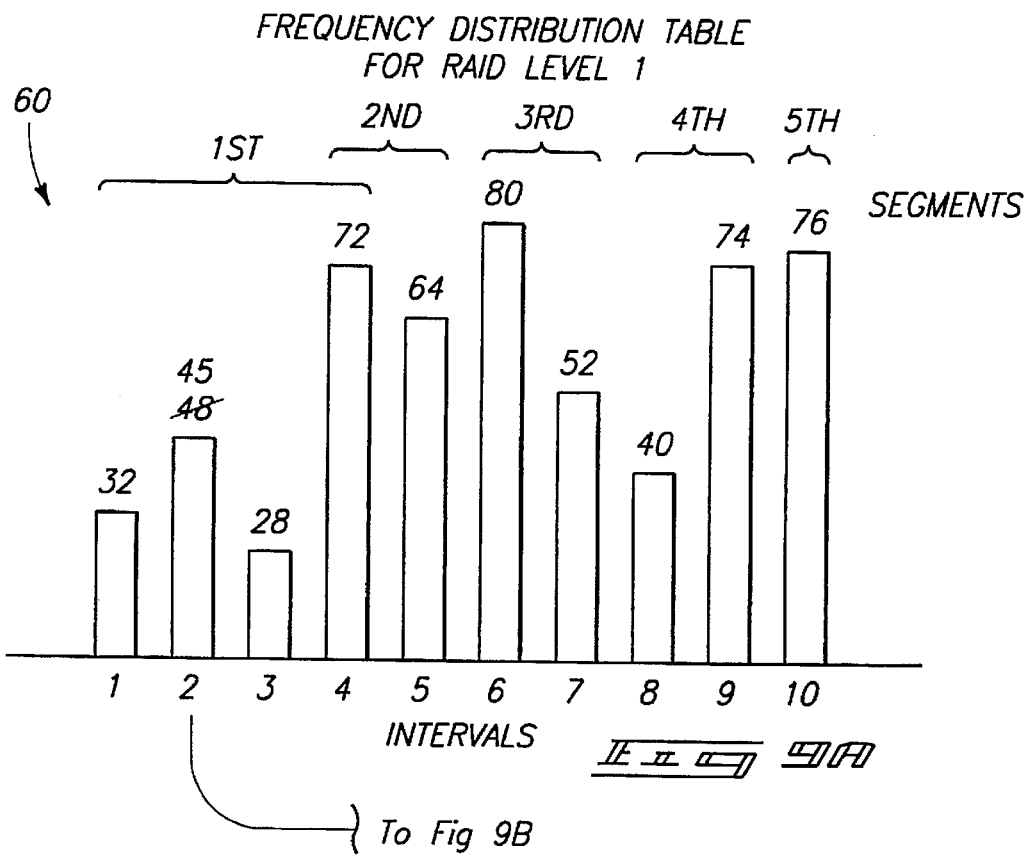
FIG. 9 shows two frequency distribution tables, one for RAID Level 1 and a second for RAID Level 5, where the RAID Level 1 table is the same as that shown in FIG. 5.
Figure 9B:
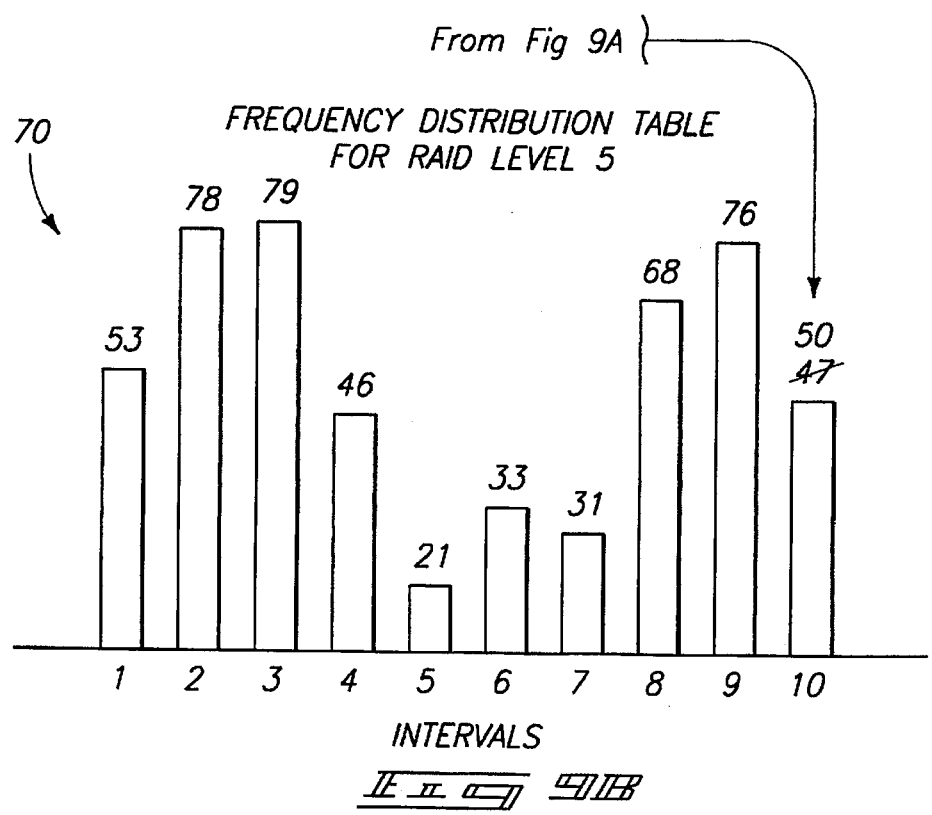

The stamp for each virtual block is sequentially checked (as indicated by the flow arrows in FIG. 6) against the interval fields 68 until a match occurs (step 107 in FIG. 9). For example, assume that the virtual block had a stamp that fell within the interval in the third interval field. The virtual block stamp would first be evaluated against the interval in the first interval field. Since the virtual block falls outside this interval field, it is next compared to the second interval field. It is noted that each interval field contains pointers to direct analysis to the address for the next interval field. The process continues field by field until the virtual block stamp is compared and found to fit in the appropriate interval field (which in this case, is the third interval field), whereupon the count for that interval field in incremented (step 108 in FIG. 9). It is noted that unused virtual blocks have no stamp associated with them, and thus are not represented in the table. By maintaining top and last interval pointer values, the population queue 64 can readily find and point to the top and last interval fields 68.

As virtual blocks are scanned and the statistical information extracted, population queue 64 begins to fill and free queue 66 begins to empty. When the table contains a count in each interval, the free queue 66 will be empty (as denoted by the null or ground symbols in the free queue). It is noted that when two or more tables are desired (as described below in more detail), they can be created simultaneously during the same scanning step.

Once the frequency distribution tables are established, they are ready for use. The flow diagrams of FIGS. 11 and 12 demonstrate two preferred modes of operation involving the frequency distribution tables, although other operations using the frequency distribution tables are likely. The first or host access mode of operation is to update the tables as the user accesses existing or new virtual blocks. The second or migration mode of operation concerns segmenting the tables to identify virtual blocks for use in migration between RAID areas and updating the frequency distribution tables.

FIG. 11 shows the host access mode of operation wherein the tables are continually updated as existing and new virtual blocks are used to store user data. At step 109, it is first determined whether the user is accessing an existing virtual block or is creating a new virtual block. If the user is accessing an existing virtual block (i.e., the "no" branch from step 109), a new stamp is applied to the existing virtual block. The frequency distribution tables are updated to reflect the new stamp. This is done by decrementing the count of the interval containing the old stamp (step 110) and then incrementing the count of the interval containing the new stamp following step 111.

Figure 7:
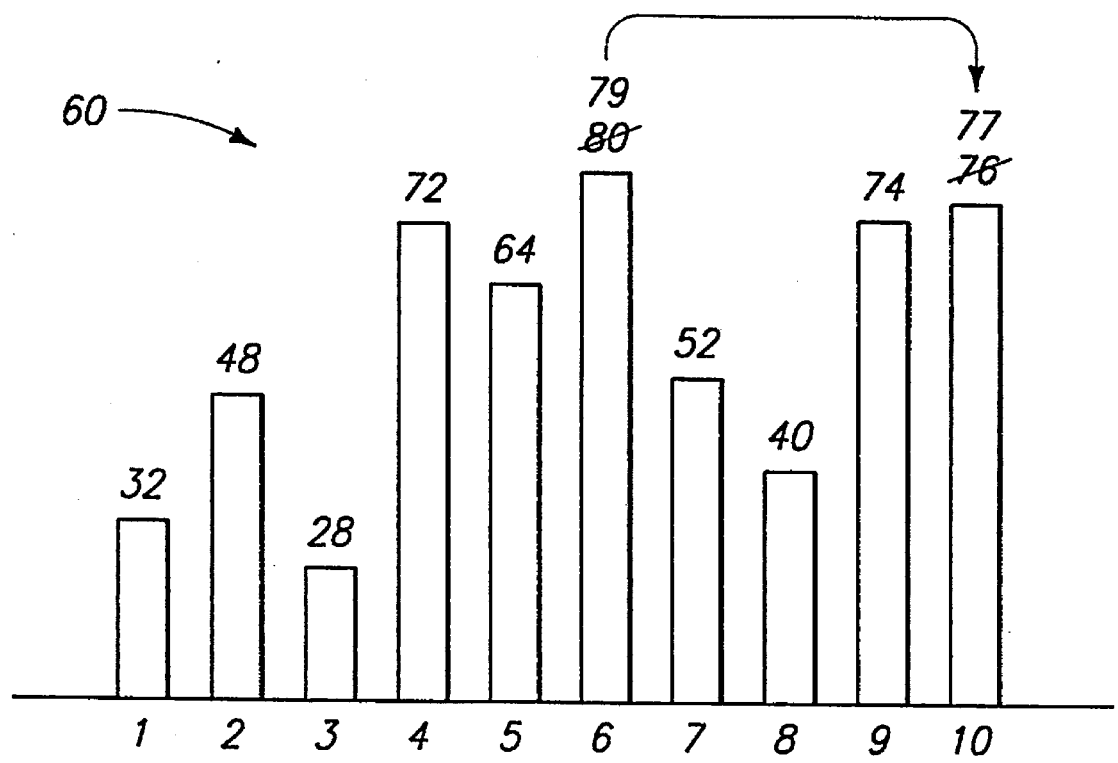
FIG. 7 shows an updating process resulting from accessing an existing virtual block in the frequency distribution table of FIG. 5.

FIG. 7 illustrates the process of updating a table when an existing virtual block is accessed. Here, a virtual block having a time stamp in the range of interval 6 is accessed. A new, most recent time stamp is then tagged to the virtual block. One significant advantage to having a monotonically increasing stamp is that the system can easily locate and handle the most recently/frequently accessed and least recently/frequently accessed virtual blocks because these blocks are located in the first and last intervals. The most recent time stamp therefore expectedly falls within the range of interval 10. The frequency distribution table 60 is updated by decrementing the count of interval 6 by one (80 to 79) and incrementing the count of interval 10 by one (76 to 77).

With reference to FIG. 11, if the virtual block is new (i.e., the "yes" branch of step 109), analysis continues at decision step 111 in FIG. 11 to determine whether the new virtual block fits an existing interval within a table. Given the monotonic nature of stamping virtual blocks, the virtual block is simply compared to the last interval of the table. If the new virtual block fits the last interval (i.e., the "yes" path from decisional step 111), the count associated with that last interval is incremented (step 112). For instance, if a virtual block has a time stamp falling in the range of interval 10, the count of interval 10 is incremented from 76 to 77. On the other hand, if the virtual block has a stamp that does not satisfy any of the last intervals (i.e., the "no" path from decisional step 111), the RAID management system quickly checks if any intervals are free (step 113). This situation occurs when less than the set number of intervals (e.g., ten intervals in the continuing example) have been used to describe the frequency distribution of the last virtual blocks. If an interval is free (i.e., the "yes" branch from step 113), the new last interval is defined at step 116 to contain the new virtual block.

When no free intervals exist (i.e., the "no" branch from step 113), a new interval must be created to accommodate the increasing distribution range. Creating a new interval requires some adjustment to the frequency distribution table because it is bounded with a fixed number of intervals. The RAID management system does not merely add a new interval. Instead, the RAID management system first makes room within the table to accommodate the new interval.

FIG. 8 illustrates the process of generating a new interval. The RAID management system first combines adjacent intervals to form a new joint interval (step 114 in FIG. 11). The new joint interval has a count that equals the sum of the counts of the two intervals that are joined. Preferably, the adjacent two intervals with the smallest combined count are selected. In FIG. 8, intervals 2 and 3 are joined to form a new interval 2 in table 60'. The count of the new interval 2 is 76 (i.e., 48+28=76).

This process frees up space in the frequency distribution table for definition of a new last interval (step 116 in FIG. 11 ), such as new last interval 10. The count for the new last interval is then incremented to reflect the new virtual block (step 118). In table 60', the new last interval 10 has a count of one to signify statistically that the new virtual block fits that interval and did not fit the previous intervals. Through the joining process, the frequency distribution table remains bounded and easy to handle, and the statistical information therein is accurately maintained.

As noted above, in the preferred implementation of this invention, one frequency distribution table is constructed for each RAID level. When the hierarchic disk array uses RAID Levels 1 and 5, a first frequency distribution table is created for virtual blocks associated with mirror RAID areas of RAID Level 1 and a second frequency distribution table is created for virtual blocks associated with parity RAID areas of RAID Level 5. If three or more RAID Levels are used, then three or more corresponding tables are created. An example use of this memory arrangement might be to migrate "middle-aged" virtual blocks to a level of storage that has performance characteristics most suitable for their particular data.

FIG. 9 shows two frequency distribution tables 60 and 70. Upper table 60 is used to characterize virtual blocks that are associated with RAID Level 1 storage. Lower table 70 is used to characterize virtual blocks that are associated with RAID Level 5 storage.

FIG. 9 also illustrates the effect of migration on the frequency distribution tables for the different RAID levels. The method for using the table for migration is shown in the migration mode of operation in FIG. 12. For purposes of this example, the tables in FIG. 9 are based upon the distribution criteria of data access recency and the intervals are temporal in scope. Assume that the RAID management system 16 wants to migrate "older" virtual block from mirror to parity storage to free up mirror storage for new data. In this case, the mirror RAID areas operate as the source RAID areas for data migration and the parity RAID areas operate as the target RAID areas (step 120 in FIG. 12).

The RAID management system first divides the population of virtual blocks in table 60 into a plurality of equal size segments having approximately the same number of elements (step 122). For example, the RAID management system might divide the population into five segments, as shown at the top of table 60 in FIG. 9. For a population of 566, each segment should theoretically represent approximately 113 virtual blocks. The first segment spans intervals 1–4 because intervals 1–3 only have 105 virtual blocks, below the threshold 113 virtual blocks for each segment.

The RAID management system then chooses the first segment since it will contain the older virtual blocks (step 124 in FIG. 12). Any virtual block having a time stamp falling within the temporal intervals referenced generically as 1–4 will satisfy this criterion. The RAID management system determines the uppermost boundary value of the first segment which, in this example, is the ending boundary time value of interval 4. The ending boundary time value is computed by taking the beginning boundary time value of interval 4 and adding the size of interval 4. The ending boundary time value is used as a threshold for comparison.

The RAID management system then searches through the virtual blocks in the application-level virtual storage space to actually locate one or more virtual blocks (step 126). The time stamp of each virtual block is compared to the threshold time value to see if the virtual block has a time stamp earlier than the threshold time value, thereby placing the virtual block in the first segment. Once a sufficient number of virtual blocks are found, the search is halted. The located virtual blocks are then migrated from mirror storage to parity storage (step 128).

The two frequency distribution tables 60 and 70 are updated to reflect the migration (step 130). Suppose that the migration of three virtual blocks previously represented in interval 2 of RAID Level 1 table 60 is now reflected in interval 10 of RAID Level 5 table 70. The count associated with interval 2 in table 60 is simply decremented by three (from 48 to 45) to reflect the loss of the virtual blocks. Similarly, the count associated with interval 10 in table 70 is incremented by three (from 47 to 50) to reflect the gain of the virtual blocks. It is noted that the time stamps of the three virtual blocks do not change during migration. Rather, only the statistical information for each RAID level is modified to reflect the change in distribution resulting from the data migration.

It is noted that the migration is preferably performed in a continuous fashion, as opposed to a batch procedure. Accordingly, once a criterion-satisfying block is found, it is migrated, and the tables updated, in a block-by-block manner.

The use of frequency distribution tables affords more advantages than the full sorting technique. The statistical approach yields significantly better performance than sorting methods, while employing significantly less memory resource. The process of segmenting the population, choosing a segment to identify virtual blocks, and then quickly searching to find the virtual blocks approximates the full sorting technique. Only it accomplishes the task in a more efficient and cost effective manner because it enables intelligent selection without expense. Additionally, the process can be stopped as soon as a sufficient number of virtual blocks are found in the identified segment. By stopping earlier, the truncated time frame is generally significantly less than that required to perform a full sort.

Another benefit is that the processing time is a linear function of the number of virtual blocks (for searching) unlike the non-linear function of full sorting techniques. Thus, older/younger and less recently/more recently accessed virtual blocks can be more quickly identified with respect to the amount of user data stored on the disk array.

The use of statistical frequency distribution tables can also be used to select data for movement between different types of storage devices. For example, if the data storage system was further equipped with a back-up storage mechanism, such as reel-to-reel tape storage, the statistical frequency distribution table could be used to select "ancient" storage blocks for data movement from the disk array to the back-up storage mechanism.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for selecting data in a data storage system; the data storage system comprising multiple storage disks that define a physical storage space, the physical storage space being mapped into a virtual storage space which presents the physical storage space as a population of multiple virtual blocks; the method comprising the following steps:

creating a bounded frequency distribution table that characterizes data stored on the data storage system according to a predetermined distribution criteria, the frequency distribution table having a selected number of intervals where individual intervals have various counts of the number of virtual blocks that satisfy the distribution criteria for the associated interval;

segmenting the frequency distribution table to identify a selection criterion for virtual blocks that are a subset of the population; and searching the virtual blocks in the virtual storage space to locate one or more virtual blocks that satisfy the selection criterion.

2. A method according to claim 1 further comprising the additional step of tagging the virtual blocks with a time stamp indicating when the data was stored in the virtual blocks; and wherein the predetermined distribution criteria is data access recency and the intervals are temporal in scope where the count associated with a temporal interval represents the number of virtual blocks having time stamps within that temporal interval.

3. A method according to claim 1 further comprising the additional step of tagging the virtual blocks with a frequency stamp indicating the number of times the data therein has been accessed; and wherein the predetermined distribution criteria is data access frequency and the intervals relate to frequency values where the counts associated with the intervals represent the number of virtual blocks having frequency values within the respective intervals.

4. A method according to claim 1 wherein the step of creating the frequency distribution table comprises scanning the virtual blocks in the virtual storage space to count the number of virtual blocks that satisfy the distribution criteria for individual intervals.

5. A method according to claim 1 further comprising the following additional steps:

updating the frequency distribution table as new virtual blocks are used; and said updating step alternately comprising: (1) in the event that a new virtual block satisfies the distribution criteria for an existing interval, incrementing the count associated with that existing interval; and (2) in the event that a new virtual block fails to satisfy the distribution criteria for an existing interval, generating a new interval and entering an initial count for that new interval.

6. A method according to claim 5 wherein the step of generating a new interval comprises:

joining at least two intervals within the frequency distribution table to define a joint interval, the count associated with the joint interval being the sum of the counts of the two intervals that are joined; and defining a new interval which extends the distribution criteria to cover the new virtual block.

7. A method according to claim 1 further comprising the following additional steps:

updating the frequency distribution table as an existing virtual block is accessed; and said updating step comprising decrementing the count of an interval for which the existing virtual block satisfied the distribution criteria prior to access and incrementing the count of another interval for which the existing virtual block satisfied the distribution criteria subsequent to access.

8. A method according to claim 1 further comprising the additional step of tagging the virtual blocks with a monotonically increasing stamp so that newer stamped virtual blocks are counted in a last interval of the frequency distribution table.

9. A method for selecting data for migration in a hierarchic data storage system; the data storage system comprising multiple storage disks that define a physical storage space, the physical storage space being mapped into a RAID-level virtual storage space which presents the physical storage space as at least two RAID areas that store data according to different RAID levels, the RAID-level virtual storage space being mapped into an application-level virtual storage space which presents the physical storage space as a population of multiple virtual blocks; the method comprising the following steps:

creating a bounded first frequency distribution table that characterizes data stored in a first RAID area under a first RAID level according to a predetermined distribution criteria, the first frequency distribution table having a selected number of intervals, individual intervals having various counts of the number of virtual blocks that satisfy the distribution criteria for the associated interval;

creating a bounded second frequency distribution table that characterizes data stored in a second RAID area under a second RAID level according to a predetermined distribution criteria, the second frequency distribution table having a selected number of intervals, individual intervals having various counts of the numbers of virtual blocks that satisfy the distribution criteria for the associated interval;

defining a plurality of segments of the first population, individual segments including one or more intervals of the first frequency distribution table;

choosing at least one segment from the plurality of segments;

searching the virtual blocks in the application-level virtual storage space to locate one or more virtual blocks that satisfy the distribution criteria for the one or more intervals included within the chosen segment, the located virtual blocks representing data stored in the first RAID area under the first RAID level; and migrating the located virtual blocks from the first RAID area to the second RAID area.

10. A method according to claim 9 further comprising the additional step of tagging the virtual blocks with a stamp having a monotonically increasing value so that newer stamped virtual blocks are counted in last intervals of the first and second frequency distribution tables.

11. A method according to claim 9 further comprising the additional step of tagging the virtual blocks with a time stamp indicating when the data was stored in the virtual blocks; and wherein the predetermined distribution criteria is data access recency and the intervals are temporal in scope where the count associated with a temporal interval represents the number of virtual blocks having time stamps within that temporal interval.

12. A method according to claim 9 further comprising the additional step of tagging the virtual blocks with a frequency stamp indicating the number of times the data therein has been accessed; and wherein the predetermined distribution criteria is data access frequency and the intervals relate to frequency values where the counts associated with the intervals represent the number of virtual blocks having frequency values within the respective intervals.

13. A method according to claim 9 further comprising the following additional steps:

decrementing the count associated with the individual intervals in the first frequency distribution table to reflect loss of the one or more virtual blocks from the first RAID level; and incrementing the count associated with the individual intervals in the second frequency distribution table to reflect the gain of one or more virtual blocks to the second RAID level.

14. A method according to claim 9 further comprising the following additional steps:

updating the first and second frequency distribution tables as new virtual blocks are used; and said updating step alternately comprising: (1) in the event that a new virtual block satisfies the distribution criteria for an existing interval, incrementing the count associated with that existing interval; and (2) in the event that a new virtual block fails to satisfy the distribution criteria for an existing interval, generating a new interval and entering an initial count for that new interval.

15. A method according to claim 14 wherein the step of generating a new interval comprises:

joining at least two intervals within the frequency distribution table to define a joint interval, the count associated with the joint interval being the sum of the counts of the two intervals that are joined; and defining a new interval which extends the distribution criteria to cover the new virtual block.

16. A method according to claim 9 further comprising creating more than two bounded frequency distribution tables to characterize data stored in corresponding RAID areas under RAID levels other than the first and second RAID levels.

17. A method for operating a data storage system; the data storage system comprising multiple storage disks that define a physical storage space; the method comprising the following steps:

mapping the physical storage space into a RAID-level virtual storage space which presents the physical storage space as at least first and second RAID areas where the first RAID areas store data according to a first RAID level and the second RAID areas store data according to a second RAID level;

mapping the RAID-level virtual storage space into an application-level virtual storage space which presents the physical storage space as multiple virtual blocks including first virtual blocks associated with the first RAID areas and second virtual blocks associated with the second RAID areas;

storing data in the first and second virtual blocks;

creating a frequency distribution table that characterizes the first virtual blocks according to a predetermined distribution criteria;

selecting at least one first virtual block by segmenting the frequency distribution table to identify a selection criterion for virtual blocks and locating at least one of the virtual blocks in the application-level virtual storage space that satisfy the selection criteria; and migrating the selected first virtual block from a first RAID area to a second RAID area.

18. A data storage system comprising:

a disk array having a plurality of storage disks that define a physical storage space;

a disk array controller coupled to the disk array for coordinating data transfer to and from the disks;

a RAID management system operatively coupled to the disk array controller for mapping a RAID-level virtual storage space and an application-level virtual storage space into the physical storage space of the storage disks; the RAID-level virtual storage space presenting the physical storage space as multiple RAID areas that store data according to various RAID levels; the application-level virtual storage space presenting the physical storage space as a population of multiple virtual blocks;

the RAID management system migrating virtual blocks between first and second RAID areas on the storage disks;

first and second bounded frequency distribution tables that characterize data stored in the first and second RAID areas according to a predetermined distribution criteria, the frequency distribution tables having selected numbers of intervals, individual intervals having various counts of the number of virtual blocks that satisfy the distribution criteria for the associated intervals; and the RAID management system selecting the virtual blocks for migration by segmenting one of the first and second frequency distribution tables to identify a selection criterion for virtual blocks which comprise a subset of their respective populations.

19. A data storage system according to claim 18 wherein the first and second frequency distribution tables are formed in RAM.

20. A data storage system according to claim 18 further comprising means for marking the virtual blocks with a stamp having a monotonically increasing value.

21. A data storage system according to claim 20 wherein the stamp of monotonically increasing value is selected from a group consisting of a time stamp indicative of when data was stored in the virtual block and a frequency stamp indicative of the number of times the data therein has been accessed.

22. A computer-readable medium having computer-executable instructions for performing the steps in the method recited in claim 1.

23. A computer readable medium having computer-executable instructions for performing the steps in the method recited in claim 9.

24. A computer-readable medium having computer-executable instructions for performing the steps in the method recited in claim 17.

* * * * *